(12) United States Patent
Zhang et al.

(10) Patent No.: US 11,527,712 B2
(45) Date of Patent: Dec. 13, 2022

(54) LOW CURRENT RRAM-BASED CROSSBAR ARRAY CIRCUITS IMPLEMENTED WITH INTERFACE ENGINEERING TECHNOLOGIES

(71) Applicant: TETRAMEM INC., Newark, CA (US)

(72) Inventors: Minxian Zhang, Newark, CA (US); Ning Ge, Newark, CA (US)

(73) Assignee: TetraMem Inc., Fremont, CA (US)

( * ) Notice: Subject to any disclaimer, the term of this patent is extended or adjusted under 35 U.S.C. 154(b) by 0 days.

(21) Appl. No.: 16/921,926

(22) Filed: Jul. 6, 2020

(65) Prior Publication Data

US 2022/0006008 A1 Jan. 6, 2022

(51) Int. Cl.
*H01L 45/00* (2006.01)
*H01L 27/24* (2006.01)

(52) U.S. Cl.
CPC ...... *H01L 45/1233* (2013.01); *H01L 27/2463* (2013.01); *H01L 45/1253* (2013.01); *H01L 45/146* (2013.01)

(58) Field of Classification Search
CPC ............... H01L 45/1253; H01L 45/146; H01L 27/2463; H01L 45/1233; H01L 45/1246
See application file for complete search history.

(56) References Cited

U.S. PATENT DOCUMENTS

| 2009/0272962 | A1* | 11/2009 | Kumar | ................ H01L 45/1641 257/4 |
| 2013/0168632 | A1* | 7/2013 | Moon | ................ H01L 45/1246 257/4 |
| 2017/0346006 | A1* | 11/2017 | Nabatame | ........... H01L 45/1616 |

* cited by examiner

*Primary Examiner* — Shih Tsun A Chou
(74) *Attorney, Agent, or Firm* — Jaffery Watson Mendonsa & Hamilton LLP

(57) ABSTRACT

Interface engineering technologies relating to low current RRAM-based crossbar array circuits are disclosed. An apparatus, in some implementations, includes: a substrate; a bottom electrode formed on the substrate; a first geometric confining layer formed on the bottom electrode. The first geometric confining layer comprises a first plurality of pin-holes. The apparatus further comprises a base oxide layer formed on the first geometric confining layer and connected to a first top surface of the bottom electrode via the first pin-holes; and a top electrode formed on the base oxide layer. The base oxide layer comprises one of: $TaO_x$, $HfO_x$, $TiO_x$, $ZrO_x$, or a combination thereof; the first geometric confining layer comprises $Al_2O_3$, $SiO_2$, $Si_3N_4$, $Y_2O_3$, $Gd_2O_3$, $Sm_2O_3$, $CeO_2$, $Er_2O_3$, or a combination thereof.

14 Claims, 5 Drawing Sheets

LOW CURRENT RRAM-BASED CROSSBAR ARRAY CIRCUITS IMPLEMENTED WITH INTERFACE ENGINEERING TECHNOLOGIES

TECHNICAL FIELD

The present disclosure relates generally to crossbar array circuits with one or more Resistive Random-Access Memories (RRAMs) and more specifically to low current RRAM-based crossbar array circuits implemented with switching oxide engineering technologies.

BACKGROUND

Conventionally, a crossbar array circuit may include horizontal electrode rows and vertical electrode columns (or other electrodes) intersecting with each other, with crossbar devices formed at the intersecting points. The crossbar array may be used in non-volatile solid-state memory, signal processing, control systems, high-speed image processing, neural network, and other applications.

An RRAM is a two-terminal passive device that is capable of changing its resistance responsive sufficient electrical stimulations. These characteristics have attracted significant attention for high-performance nonvolatile memory applications. The resistance of the RRAM may be electrically switched between two states: a High-Resistance State (HRS) and a Low-Resistance State (LRS). Switching an RRAM from an HRS to an LRS may be referred to as a "Set" or "On" operation. Conversely, switching an RRAM from an LRS to an HRS may be referred to as a "Reset" or "Off" operation.

RRAMs implemented in crossbar arrays may provide In-Memory Computing (IMC) capabilities due to their multilevel capability and stability of each resistance level. To provide IMC architectures using RRAM-based crossbar array circuit, such capabilities as providing analog behaviors, a multi-states storage, ultra-low power consumption, and progressive voltage/current programming are desired.

Further, in filamentary RRAMs, after a filament is formed within an RRAM, the resistance of RRAM in LRS becomes and remains low, resulting in high currents within the RRAM, rendering the RRAM undesirable for low energy applications.

Providing desirable technical features in low current RRAM-based crossbar array circuits thus remain technically challenging.

SUMMARY

Interface engineering technologies relating to low current RRAM-based crossbar array circuits are disclosed.

An apparatus, in some implementations, includes: a substrate; a bottom electrode formed on the substrate; a first geometric confining layer formed on the bottom electrode. The first geometric confining layer comprises a first plurality of pin-holes. The apparatus further comprises a base oxide layer formed on the first geometric confining layer and connected to a first top surface of the bottom electrode via the first pin-holes; and a top electrode formed on the base oxide layer. The base oxide layer comprises one of: $TaO_x$, $HfO_x$, $TiO_x$, $ZrO_x$, or a combination thereof; the first geometric confining layer comprises $Al_2O_3$, $SiO_2$, $Si_3N_4$, $Y_2O_3$, $Gd_2O_3$, $Sm_2O_3$, $CeO_2$, $Er_2O_3$, or a combination thereof.

The apparatus, in some implementations, includes: the base oxide layer is at least three times as thick as the first geometric confining layer.

The apparatus, in some implementations, further includes a second geometric confining layer formed on the base oxide layer. The second geometric confining layer comprises a second plurality of pin-holes, and the top electrode is formed on the second geometric confining layer and is connected to a second top surface of the base oxide layer via the second pin-holes.

In some implementations, the base oxide layer is at least three times as thick as the second geometric confining layer.

In some implementations, the second geometric confining layer comprises $Al_2O_3$, $SiO_2$, $Si_3N_4$, $Y_2O_3$, $Gd_2O_3$, $Sm_2O_3$, $CeO_2$, $Er_2O_3$, or a combination thereof.

In some implementations, the second geometric confining layer and the first geometric confining layer are made of different materials.

In some implementations, the substrate comprises Si, $Si_3N_4$, $SiO_2$, $Al_2O_3$, or a combination thereof.

The apparatus, in some implementations, further includes: a column wire connected to the bottom electrode; and a row wire connected to the top electrode.

An apparatus, in some implementations, includes: a substrate; a bottom electrode formed on the substrate; a base oxide layer formed on the bottom electrode; a first geometric confining layer formed on the base oxide layer. The first geometric confining layer comprises a first plurality of pin-holes. The apparatus further includes a top electrode formed on the first geometric confining layer and contacted to a first top surface of the base oxide layer via the first plurality of pin-holes. The base oxide layer comprises $TaO_x$, $HfO_x$, $TiO_x$, $ZrO_x$, or a combination thereof; the first geometric confining layer comprises $Al_2O_3$, $SiO_2$, $Si_3N_4$, $Y_2O_3$, $Gd_2O_3$, $Sm_{203}$, $CeO_2$, $Er_2O_3$, or a combination thereof.

In some implementations, the base oxide layer is at least three times as thick as the first geometric confining layer.

An apparatus, in some implementations, includes: a substrate; a bottom electrode formed on the substrate; a first base oxide layer formed on the bottom electrode; a first geometric confining layer formed on the first base oxide layer. The first geometric confining layer comprises a first plurality of pin-holes. The apparatus further includes a second base oxide layer formed on the first geometric confining layer and connected to a first top surface of the first base oxide layer via the first plurality of pin-holes; and a top electrode formed on the second base oxide layer. The first base oxide layer comprises $TaO_x$, $HfO_x$, $TiO_x$, $ZrO_x$, or a combination thereof; the first geometric confining layer comprises $Al_2O_3$, $SiO_2$, $Si_3N_4$, $Y_2O_3$, $Gd_2O_3$, $Sm_2O_3$, $CeO_2$, $Er_2O_3$, or a combination thereof.

In some implementations, the first base oxide layer is at least three times as thick as the first geometric confining layer.

In some implementations, the second base oxide layer is at least three times as thick as the first geometric confining layer.

In some implementations, the second base oxide layer comprises $TaO_x$, $HfO_x$, $TiO_x$, $ZrO_x$, or a combination thereof.

In some implementations, the second base oxide layer and that of the first base oxide layer are made of different materials.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Technologies relating to low current RRAM-based crossbar array circuits with interface engineering are disclosed. The technologies described in the present disclosure may provide the following technical advantages.

First, the disclosed technologies increase the resistance of a low current RRAM in both the LRS and the HRS. This resistance increase may decrease the Set/Reset current and the reading currents of the resistance levels with a certain reading voltage, which increases the overall power efficiency, a desirable feature for IMC applications.

Second, the disclosed technologies do not require modifications beyond the interface between a base oxide and an electrode, reducing the complexity for manufacturing such RRAMs and thus increasing the production reliability and the production yield.

Figure 1:
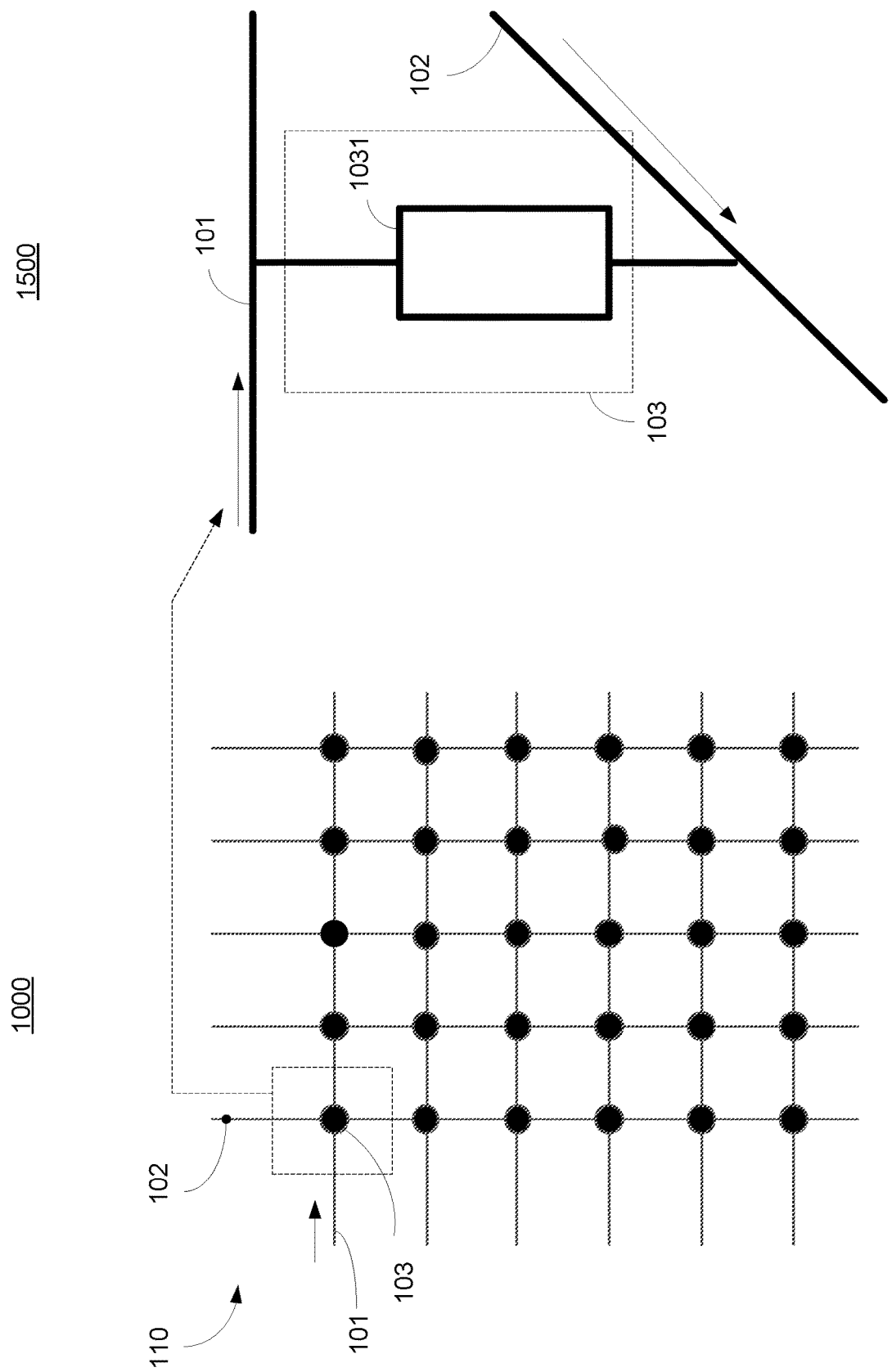
FIG. 1A is a block diagram illustrating an example crossbar array circuit in accordance with some implementations of the present disclosure.
FIG. 1B is a block diagram illustrating a partially enlarged view of the example crossbar device shown in FIG. 1A in accordance with some implementations of the present disclosure.

FIG. 1A is a block diagram 1000 illustrating an example crossbar array circuit 110 in accordance with some implementations of the present disclosure. As shown in FIG. 1A, the crossbar array circuit 110 includes a first row wire 101, a first column wire 102, and a crossbar device 103.

FIG. 1B is a block diagram 1500 illustrating a partially enlarged view of the crossbar device 103 in accordance with some implementations of the present disclosure. In FIG. 1B, the crossbar device 103 is connected to the first row wire 101 and to the first column wire 102. In some implementations, the crossbar device 103 includes an RRAM cell 1031. The RRAM cell 1031 may be connected to a transistor to form a one-Transistor-one-memristor (1T1R) stack, or to a selector to form a one-Selector-one-memristor (1S1R) stack, or a single memristor (1R) stack.

Figure 2:
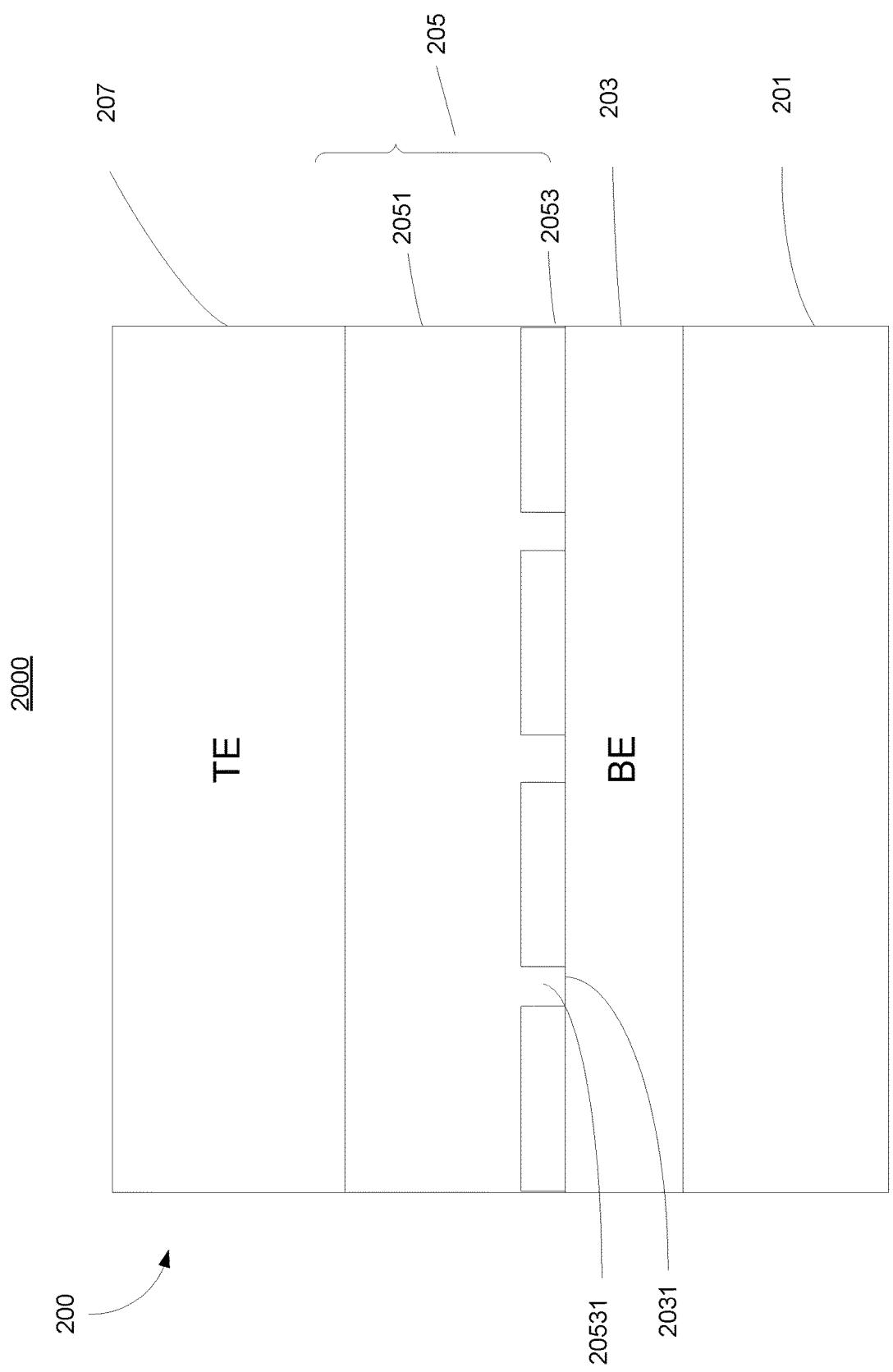
FIG. 2 is a block diagram illustrating an example RRAM cell in accordance with some implementations of the present disclosure.

FIG. 2 is a block diagram 2000 illustrating an example RRAM cell 200 in accordance with some implementations of the present disclosure.

As shown in FIG. 2, the RRAM cell 200 includes a substrate 201, a bottom electrode 203 formed on the substrate 201, a switching oxide stack 205 formed on the bottom electrode 203, and a top electrode 207 formed on the switching oxide stack 205.

The switching oxide stack 205 includes a geometric confining layer 2053 formed on the bottom electrode 203, and a base oxide layer 2051 formed on the geometric confining layer 2053 and the bottom electrode 203. The geometric confining layer 2053 may be a non-continuous layer that includes a predefined number of pin-holes 20531.

The base oxide layer 2051 may be filled and formed in the pin-holes 20531 and connected to a top surface 2031 of the bottom electrode 203. The conductive filament formed within the RRAM cell 200 may be configured to grow and form on regions in alignment with these pin-holes 20531. In these ways, the contact resistance of the RRAM cell 200 may be increased, because the contact area is narrowed. These confined interfaces may produce a lower current RRAM.

In some implementations, the substrate 201 is made of at least one of the following materials: Si, $Si_3N_4$, $SiO_2$, $Al_2O_3$, or a combination thereof. In some implementations, the bottom electrode 203 is made of: Ag, Al, Au, Cu, Fe, Ni, Mo, Pt, Pd, Ti, TiN, TaN, W, Zr, Ir, Ru, a combination thereof, or an alloy of any of these materials with any other electrically conductive materials. In some implementations, the top electrode 207 is made of: Ag, Al, Au, Cu, Fe, Ni, Mo, Pt, Pd, Ti, TiN, TaN, W, Zr, Ir, Ru, a combination thereof, or an alloy of any of these materials with any other electrically conductive materials.

In some implementations, the switching oxide stack 205 functions as a filament forming stack, within which one or more filaments may form. The top electrode 207 may be made of a reactive material: Ta, Hf, Zr, Ti, Ru, a combination thereof, or an alloy of any of Ta, Hf, Zr, Ti, Ru with any other electrically conductive materials; the bottom electrode 203 may be made of a non-reactive material: Pt, Pd, Ir, TiN, TaN, a combination thereof, or an alloy of any of Pt, Pd, Ir, TiN, TaN with any other electrically conductive materials. Under appropriate thermodynamic and kinetic conditions, metal from a reactive electrode may form oxygen vacancies in the switching oxide stack 205 and form a switching filament within the switching oxide stack 205.

In some implementations, a reactive material has a higher oxygen solubility and mobility than those of a switching oxide and a filament. A reactive material may create oxygen vacancies in a switching oxide and form a filament solid solution containing oxygen. A reactive material may include one of: Ta, Hf, Ti, Zr, Ru, a combination thereof, or an alloy of any of Ta, Hf, Ti, Ru and Zr with any other electrically conductive materials.

In some implementations, a non-reactive has a higher chemical stability than those of a switching oxide and a filament. A non-reactive material may include noble metal material such as: Pt, Pd, Ir, a combination thereof, or an alloy of any of Pt, Pd, Ir, with any other electrically conductive materials. A non-reactive material may also include metal nitride material such as: TiN, TaN, a combination thereof, or an alloy of any of TiN and TaN with any other electrically conductive materials.

As shown in FIGS. 1A-1B, in some implementations, a bottom electrode may be a column wire or may be connected to a column wire; a top electrode may be a row wire or may be connected to the row wire.

As shown in FIG. 2, in some implementations, the switching oxide stack 205 may be made of TaOx, HfOx, TiOx, ZrOx, or a combination thereof. The switching oxide stack 205, in some implementations, is a filament forming stack. For example, when a Set signal (e.g. a Set voltage) is applied, a conductive filament may form within the switching oxide stack 205.

In some implementations, the base oxide layer 2051 may be made of $TaO_x$, $HfO_x$, $TiO_x$, $ZrO_x$, or a combination thereof. In some implementations, the geometric confining layer 2053 may be made of $Al_2O_3$, $SiO_2$, $Si_3N_4$, $Y_2O_3$, $Gd_2O_3$, $Sm_2O_3$, $CeO_2$, $Er_2O_3$, or a combination thereof. In some implementations, the geometric confining layer 2053 is made of materials that are more stable than that of the base oxide layer 2051.

The geometric confining layer 2053 may be formed between the base oxide and the bottom electrode to confine the area a conductive filament contacting the bottom electrode. The geometric confining layer 2053 may reduce the effective filament size or reduce the size of the contact area between a filament and an electrode, thereby reducing the operating current and increasing the contact resistance. The geometric confining layer 2053 may have a thickness that is insufficient to form a continuous layer. In some implementations, the geometric confining layer 2053 includes one or more discrete islands (e.g., regions that are disconnected from each other) or a film with a plurality of pin-holes.

The geometric confining layer 2053 may be made of a material that has a relatively large interfacial energy to the layer on which the geometric confining layer 2053 grows. As a result, the geometric confining layer 2053 does not grow uniformly on the surface or the interface between an electrode and a base oxide. Rather, the geometric confining layer 2053 may initially form one or more islands and then form a layer with a plurality of pin-holes, after the geometric confining layer 2053 grows thicker as a result of more materials being deposited.

In some implementations, the geometric confining layer 2053 is made of $Al_2O_3$, and the base oxide layer 2051 is made of $HfO_x$. Atomic Layer Deposition (ALD) technologies may be used to deposit the switching oxide stack 205. In some implementations, a few cycles of $Al_2O_3$ are deposited using ALD technologies to form a geometric confining layer 2053, which may be approximately 0.2 to 0.7 nm thick. The 0.2 to 0.7 nm thick $Al_2O_3$ film formed on certain materials with which high interfacial energies are resulted the $Al_2O_3$ film may not be continuous. Next, $HfO_x$ may be deposited using ALD technologies to form a base oxide 2051 that is approximately 3 nm thick. In some implementations, the thickness of the base oxide layer 2051 is three times greater than that of the geometric confining layer 2053. As such, the base oxide layer 2051 is thicker than the geometric confining layer 2053. This thickness difference allows a switching oxide stack to maintain its filament forming mechanism.

Figure 3:
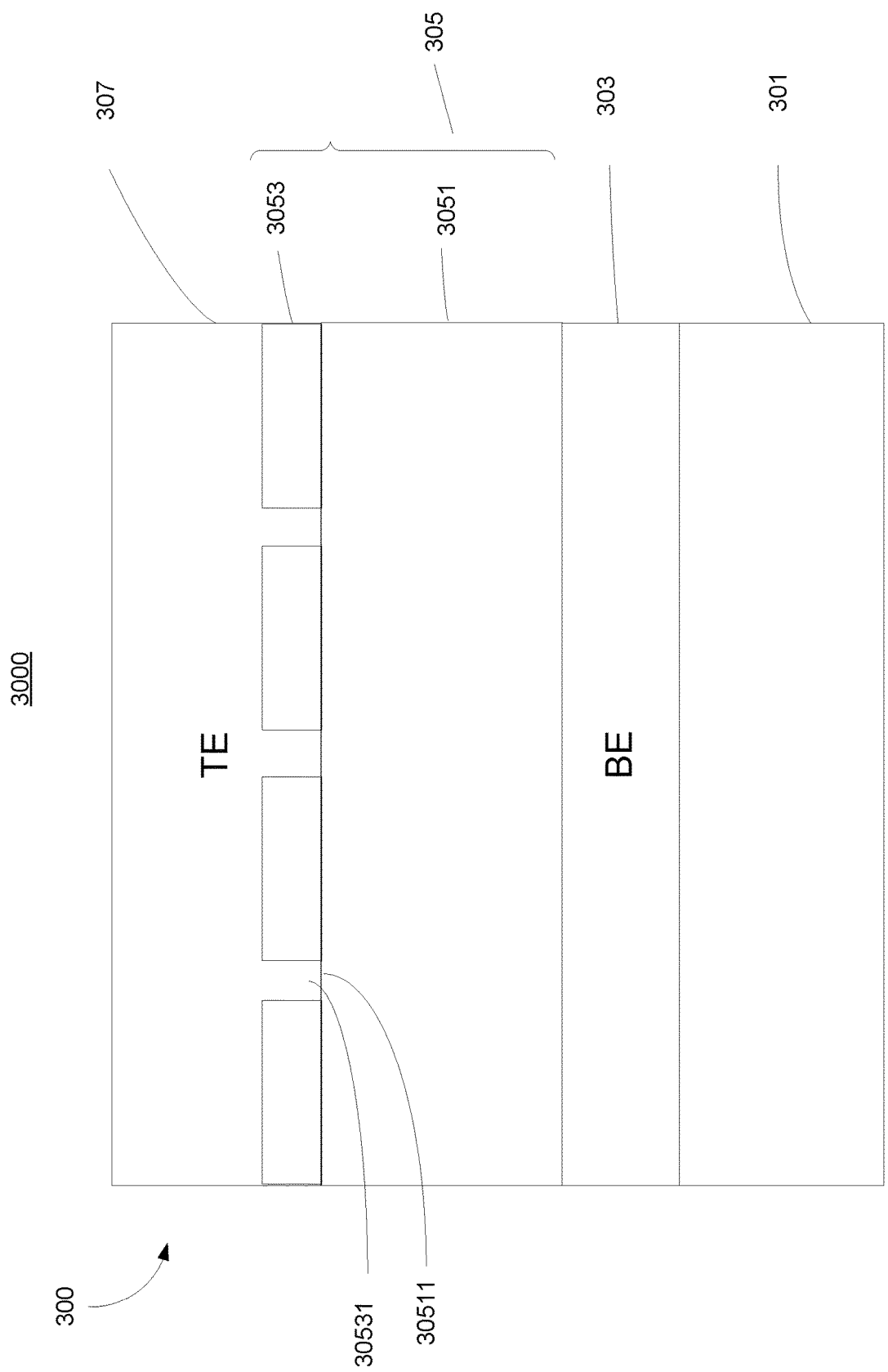
FIG. 3 is a block diagram illustrating a second example RRAM cell in accordance with some implementations of the present disclosure.

FIG. 3 is a block diagram 3000 illustrating an RRAM cell 300 in accordance with some implementations of the present disclosure.

As shown in FIG. 3, the RRAM cell 300 includes a substrate 301, a bottom electrode 303 formed on the substrate 301, a switching oxide stack 305 formed on the bottom electrode 303, and a top electrode 307 formed on the switching oxide stack 305. The switching oxide stack 305, in some implementations, includes a base oxide layer 3051 formed on the bottom electrode 303 and a geometric confining layer 3053 formed on the base oxide layer 3051.

The top electrode 307 is, in some implementations, formed on the geometric confining layer 3053 and the base oxide layer 3051. The geometric confining layer 3053 may be a non-continuous layer that includes a plurality of pin-holes 30531. The top electrode 307, in some implementations, is formed on the plurality of pin-holes 30531 and is connected to a top surface 30511 of the base oxide layer 3051. A conductive filament may form within the RRAM cell 300 and grow on regions in alignment with the pin-holes. Because the contact area between (1) the top electrode 307 and (2) the base oxide layer 3051 and the bottom electrode 303 is reduced, the contact resistance is increased. By implementing these interface engineering technologies, the RRAM cell 300 provides lower operating currents.

In some implementations, the geometric confining layer 3053 is made of $Al_2O_3$, and the base oxide layer 3051 is made of $HfO_x$. ALD technologies may be used to deposit the switching oxide stack 305. In some implementations, HfOx may be deposited using ALD technologies to form the base oxide 3051, which may be less than approximately 3 nm thick. Next, a few cycles of $Al_2O_3$ may be deposited using ALD technologies to form the geometric confining layer 3053 for about 0.2 to 0.7 nm. The $Al_2O_3$ film having a thickness around 0.2 to 0.7 nm may not be continuous. In some implementations, the thickness of the base oxide layer 3051 is three times greater than that of the geometric confining layer 3053. As such, the base oxide layer 3051 may be thicker than the geometric confining layer 3053. This thickness difference allows a switching oxide stack to maintain its filament forming mechanism.

Figure 4:
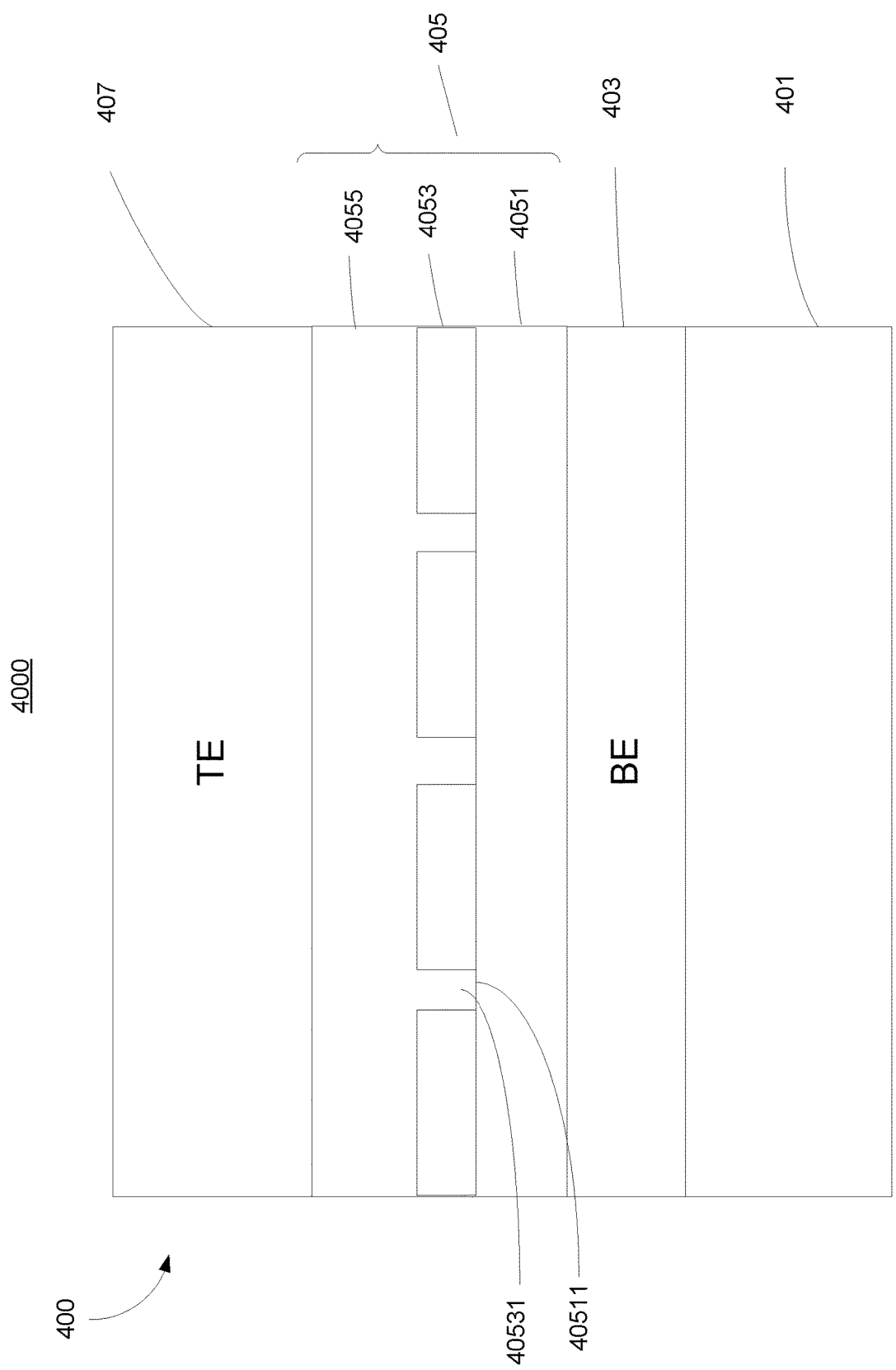
FIG. 4 is a block diagram illustrating a third example RRAM cell in accordance with some implementations of the present disclosure.

FIG. 4 shows a block diagram 4000 illustrating an RRAM cell 400 in accordance with some implementations of the present disclosure.

As shown in FIG. 4, the RRAM cell 400 includes a substrate 401, a bottom electrode 403 formed on the substrate 401, a switching oxide stack 405 formed on the bottom electrode 403, and a top electrode 407 formed on the switching oxide stack 405. The switching oxide stack 405 includes a first base oxide layer 4051 formed on the bottom electrode 403, a geometric confining layer 4053 formed on the first base oxide layer 4051, and a second base oxide layer 4055 formed on the geometric confining layer 4053 and the first base oxide layer 4051. The top electrode 407 may be formed on the second base oxide layer 4055. The geometric confining layer 4053 may be a non-continuous layer that includes a plurality of pin-holes 40531. The second base oxide layer 4055 may be filled and formed on the plurality of pin-holes 40531 and connected to a top surface 40511 of the first base oxide layer 4051. A conductive filament may form within the RRAM cell 400 and grow on regions in alignment with the plurality of pin-holes 40531. In these ways, the resistance of the RRAM cell 400 may be increased, because the contact area between the first base oxide layer 4051 and the second base oxide layer 4055 is reduced. These interface engineering technologies enable a lower operating current for the RRAM cell 400.

In some implementations, the geometric confining layer 4053 is made of $Al_2O_3$, and the first and second base oxide layers 4051 and 4055 are made of $HfO_x$. ALD technologies may be similarly used to deposit the switching oxide stack 405. In some implementations, about 2 nm $HfO_x$ may be deposited over bottom electrode 403 using ALD technologies to form the first base oxide 4051. Next a few cycles of $Al_2O_3$ may be deposited using ALD technologies to form the geometric confining layer 4053, which may be approximately 0.2 to 0.7 nm thick. The $Al_2O_3$ film having a thickness of approximately 0.2 to 0.7 nm may not be continuous. Next, $HfO_x$ may be deposited using ALD technologies to form the second base oxide layer 4055 for about 2 nm on the geometric confining layer 4053 and the top surface 40511 of the first base oxide layer 4051.

In some implementations, the first base oxide layer 4051 is at least three times as thick as the geometric confining layer 4053; in some implementations, the second base oxide layer 4055 is at least three times as thick as the geometric confining layer 4053. Thus, the first base oxide layer 4051 may be thicker than the geometric confining layer 4053, and the second base oxide layer 4055 may also be thicker than the geometric confining layer 4053. These interface engineering technologies enable the switching oxide stack 405 to maintain its filament forming capabilities, while providing an increased RRAM cell resistance.

Materials of which these layers may be the same or similar to the implementations discussed with reference to FIGS. 2-3. In some implementations, the first base oxide layer 4051 and the second base oxide layer 4055 may be made from different materials.

Figure 5:
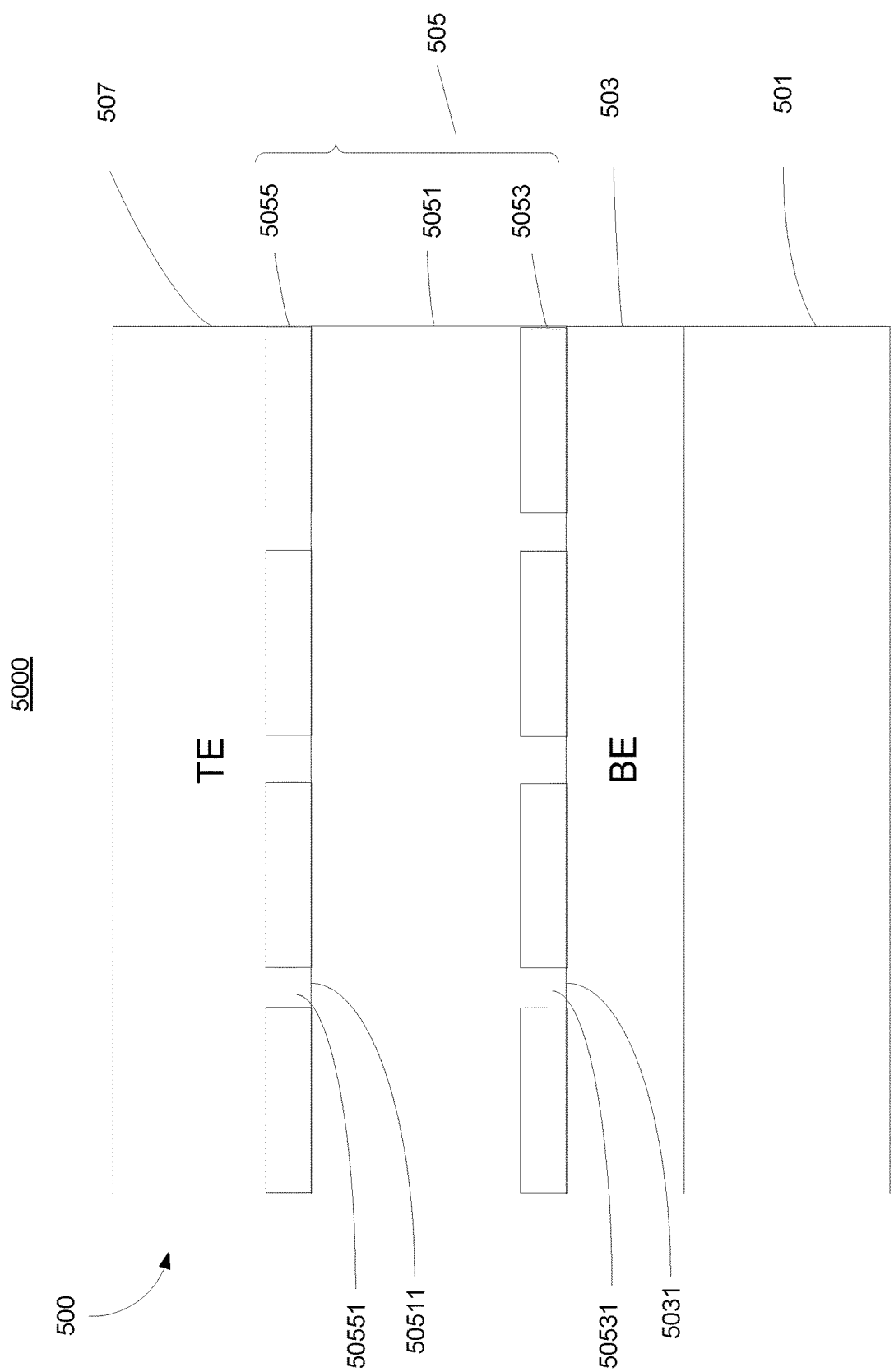
FIG. 5 is a block diagram illustrating a fourth example RRAM cell in accordance with some implementations of the present disclosure.

FIG. 5 shows a block diagram 5000 illustrating an RRAM cell 500 in accordance with some implementations of the present disclosure.

As shown in FIG. 5, the RRAM cell 500 includes a substrate 501, a bottom electrode 503 formed on the substrate 501, a switching oxide stack 505 formed on the bottom electrode 503, and a top electrode 507 formed on the switching oxide stack 505. The switching oxide stack 505 includes a first geometric confining layer 5053 formed on the bottom electrode 503, a base oxide layer 5051 formed on the first geometric confining layer 5053 and a first top surface 5031 of the bottom electrode 503, and a second geometric confining layer 5055 formed on the base oxide layer 5051. The top electrode 507 is then formed on the second geometric confining layer 5055 and a second top surface 50511 of the base oxide layer 5051. The first geometric confining layer 5053 is a non-continuous layer that includes many first pin-holes 50531, and the second geometric confining layer 5055 is also a non-continuous layer that includes many second pin-holes 50551. The base oxide layer 5051 is filled and formed in the first pin-holes 50531 and contacted to the first top surface 5031 of the bottom electrode 503 via the first pin-holes 50531. The top electrode 507 is filled and formed in the second pin-holes 50551 and contacted to a second top surface 50511 of the base oxide layer 5051 via the second pin-holes 50551. The conductive filament formed within the RRAM cell 500 is configured to grow and form in regions in alignment with these pin-holes 50531 and 50551. In these ways, the contact resistance of the RRAM cell 400 may be increased, because the contact area between the bottom electrode 503 and the top electrode 507 is narrowed. These interface engineering technologies enable a lower operating current for the RRAM cell 400.

In some implementations, the first and second geometric confining layer 5053 and 5055 are made of $Al_2O_3$, and the base oxide layer 5051 is made of $HfO_x$. ALD technologies may be similarly used to deposit the switching oxide stack 505. In some implementations, 5 cycles of $Al_2O_3$ may be deposited using ALD technologies to form the first geometric confining layer 5053, which may be approximately 0.5 nm thick. The $Al_2O_3$ film having a 0.5 nm thickness or less may not be continues, because an $Al_2O_3$ film becomes continuous when having a thickness greater than 1 nm. In some implementations, the base oxide layer 5051 is at least 3 times as thick as the first geometric confining layer 5053, or the second geometric confining layer 5055, or both. As such, the base oxide layer 5051 is thicker than the first geometric confining layer 5053, or the second geometric confining layer 5055, or both. This allows the switching oxide stack 505 to maintain its filament forming capabilities with an increased resistance.

The materials used in the implementations described with reference to FIG. 5 may be the same or similar to the materials used in the implementations described with reference to FIGS. 2-4. The first geometric confining layer 5053 and the second geometric confining layer 5055 may be made of different materials.

Plural instances may be provided for components, operations, or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation (s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
a substrate;
a bottom electrode formed on the substrate;
a first geometric confining layer formed on the bottom electrode, wherein the first geometric confining layer comprises a first film comprising a first plurality of pin-holes;
a base oxide layer formed on the first geometric confining layer and connected to a first top surface of the bottom electrode via the first plurality of pin-holes; and
a top electrode formed on the base oxide layer, wherein the base oxide layer comprises one of: $TaO_x$, $HfO_x$, $TiO_x$, $ZrO_x$, or a combination thereof, wherein the first film of the first geometric confining layer comprises $Al_2O_3$, $SiO_2$, $Si_3N_4$, $Y_2O_3$, $Gd_2O_3$, $Sm_2O_3$, $CeO_2$, $Er_2O_3$, or a combination thereof, and wherein a conductive filament forms within the based oxide layer and in regions in alignment with the first plurality of pin-holes when a set signal is applied to the top electrode and the bottom electrode.

2. The apparatus as claimed in claim 1, wherein the base oxide layer is at least three times as thick as the first geometric confining layer.

3. The apparatus as claimed in claim 1, further comprising:
a second geometric confining layer formed on the base oxide layer, wherein the second geometric confining layer comprises a second film comprising a second plurality of pin-holes, wherein the top electrode is formed on the second geometric confining layer and is connected to a second top surface of the base oxide layer via the second plurality of pin-holes, and wherein the conductive filament forms in the regions in alignment with the first plurality of pin-holes and the second plurality of pin-holes.

4. The apparatus as claimed in claim 3, wherein the base oxide layer is at least three times as thick as the second geometric confining layer.

5. The apparatus as claimed in claim 3, wherein the second geometric confining layer comprises $Al_2O_3$, $SiO_2$, $Si_3N_4$, $Y_2O_3$, $Gd_2O_3$, $Sm_2O_3$, $CeO_2$, $Er_2O_3$, or a combination thereof.

6. The apparatus as claimed in claim 5, wherein the second geometric confining layer and the first geometric confining layer comprise different materials.

7. The apparatus as claimed in claim 5, wherein the second geometric confining layer and the first geometric confining layer comprise at least one common material.

8. The apparatus as claimed in claim 1, wherein the substrate comprises Si, $Si_3N_4$, $SiO_2$, $Al_2O_3$, or a combination thereof.

9. The apparatus as claimed in claim 1, further comprises:
a column wire connected to the bottom electrode; and a row wire connected to the top electrode.

10. The apparatus as claimed in claim 1, wherein the first geometric confining layer does not grow uniformly on a surface of the bottom electrode.

11. The apparatus as claimed in claim 10, wherein a thickness of the first geometric confining layer is between 0.2 nm and 0.7 nm.

12. An apparatus comprising:
a substrate;
a bottom electrode formed on the substrate;
a base oxide layer formed on the bottom electrode;
a first geometric confining layer formed on the base oxide layer, wherein the first geometric confining layer comprises a first film comprising a first plurality of pin-holes; and
a top electrode formed on the first geometric confining layer and connected to a first top surface of the base oxide layer via the first plurality of pin-holes, wherein the base oxide layer comprises $TaO_x$, $HfO_x$, $TiO_x$, $ZrO_x$, or a combination thereof, wherein the first film of the first geometric confining layer comprises $Al_2O_3$, $SiO_2$, $Si_3N_4$, $Y_2O_3$, $Gd_2O_3$, $Sm_2O_3$, $CeO_2$, $Er_2O_3$, or a combination thereof, and wherein a conductive filament forms within the based oxide layer and in regions in alignment with the first plurality of pin-holes when a set signal is applied to the top electrode and the bottom electrode.

13. The apparatus as claimed in claim 12, wherein the base oxide layer is at least three times as thick as the first geometric confining layer.

14. The apparatus as claimed in claim 12, wherein the first geometric confining layer does not grow uniformly on a surface of the base oxide layer.

* * * * *